United States Patent
Chiu et al.

(10) Patent No.: US 11,980,096 B2
(45) Date of Patent: May 7, 2024

(54) SEMICONDUCTOR DEVICES AND METHODS FOR FORMING THE SAME

(71) Applicant: Nuvoton Technology Corporation, Hsinchu Science Park (TW)

(72) Inventors: In-Shiang Chiu, Taipei (TW); Kuang-Chu Chen, Hsinchu (TW); Peng-Chan Hsiao, Taoyuan (TW); Han-Ying Liu, Hsinchu (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 424 days.

(21) Appl. No.: 16/999,966

(22) Filed: Aug. 21, 2020

(65) Prior Publication Data

US 2021/0135082 A1 May 6, 2021

(30) Foreign Application Priority Data

Nov. 6, 2019 (TW) ................... 108140172

(51) Int. Cl.
*H10N 10/17* (2023.01)
*G01K 7/02* (2021.01)
*H10N 10/01* (2023.01)
*H10N 10/851* (2023.01)

(52) U.S. Cl.
CPC ............. *H10N 10/17* (2023.02); *H10N 10/01* (2023.02); *G01K 7/028* (2013.01); *H10N 10/851* (2023.02)

(58) Field of Classification Search
CPC ......... H01L 35/32; H01L 35/34; H01L 35/14; G01K 7/028; H10N 10/17; H10N 10/01; H10N 10/851
See application file for complete search history.

(56) References Cited

U.S. PATENT DOCUMENTS

| | | | |
|---|---|---|---|
| 8,455,828 B1 | 6/2013 | Egerton | |
| 2002/0003830 A1 | 1/2002 | Tanaka | |
| 2005/0017276 A1* | 1/2005 | Ikushima | ............ B81C 1/00047 257/293 |
| 2014/0246749 A1* | 9/2014 | Nam | ......................... G01J 5/12 257/467 |
| 2016/0079306 A1* | 3/2016 | Kropelnicki | ............... G01J 5/12 438/54 |
| 2019/0019838 A1* | 1/2019 | Kropelnicki | ...... H01L 27/14669 |
| 2019/0027522 A1* | 1/2019 | Kropelnicki | ........ H01L 27/1465 |

OTHER PUBLICATIONS

Office Action and Search_Report of corresponding TW Application 108140172 dated Apr. 10, 2020.

* cited by examiner

*Primary Examiner* — Aaron J Gray
(74) *Attorney, Agent, or Firm* — Muncy, Geissler, Olds & Lowe, P.C.

(57) ABSTRACT

A semiconductor device includes a substrate. The semiconductor device also includes a semiconductor layer disposed in the substrate. The semiconductor device further includes a first dielectric layer disposed on the semiconductor layer. The semiconductor device includes a second dielectric layer disposed on the first dielectric layer. The semiconductor device also includes a pair of thermopile segments disposed on the second dielectric layer. The first dielectric layer and the second dielectric layer form a chamber.

12 Claims, 3 Drawing Sheets

SEMICONDUCTOR DEVICES AND METHODS FOR FORMING THE SAME

CROSS REFERENCE TO RELATED APPLICATIONS

This application claims priority of Taiwan Patent Application No. 108140172 filed on Nov. 6, 2019, the entirety of which is incorporated by reference herein.

BACKGROUND OF THE INVENTION

Field of the Invention

The present disclosure relates to a semiconductor device and a method of manufacturing the same, and more particularly to a semiconductor device using a doped semiconductor layer and a dielectric layer as a reflecting layer and a method of manufacturing the same.

Description of the Related Art

In thermal sensing devices, a chamber is usually disposed under the thermopiles for thermal insulation to improve the accuracy of thermal sensing. However, in general, the chamber and thermopiles of thermal sensing devices are disposed above the operating device (e.g., transistor). When the chamber or the thermopile is formed, the related processes will be limited as the overall height of the device is already pretty high.

In addition, the operating device may contain various metal materials; furthermore, a metal reflective layer is usually disposed in the chamber to improve the accuracy of thermal sensing. Due to the low melting point of the metal materials, the thermopile materials formed subsequently will be limited to avoid damage to the low-melting-point metal during the subsequent processes.

While existing semiconductor devices used for forming thermal sensing device have been generally adequate for their intended purposes, they have not been entirely satisfactory in all respects.

BRIEF SUMMARY OF THE INVENTION

The present disclosure relates to a semiconductor device using a doped semiconductor layer and a dielectric layer as a reflecting layer and the manufacturing method of the same. Since the reflective layer of the present disclosure is not formed of low-melting-point metal material, there are more choices in the material of the thermopile segments formed subsequently. In addition, in some embodiments of the present disclosure, it is not necessary to dispose the semiconductor device above the operating device (e.g., transistor). Therefore, the thickness of the chamber will be more flexible and the related processes are less likely to be limited.

The present disclosure comprises a semiconductor device. The semiconductor device includes a substrate. The semiconductor device also includes a semiconductor layer disposed in the substrate. The semiconductor device further includes a first dielectric layer disposed on the semiconductor layer. The semiconductor device includes a second dielectric layer disposed on the first dielectric layer. The semiconductor device also includes a pair of thermopile segments disposed on the second dielectric layer. The first dielectric layer and the second dielectric layer form a chamber.

The present disclosure comprises a semiconductor device. The semiconductor device includes a substrate having a chamber. The semiconductor device also comprises a dielectric layer surrounding the chamber. The semiconductor device further comprises a semiconductor layer disposed at the bottom of the dielectric layer. The semiconductor device comprises a pair of thermopile segments disposed on the dielectric layer.

The present disclosure comprises a method for manufacturing a semiconductor device. The method for manufacturing a semiconductor device comprises providing a substrate. The method for manufacturing a semiconductor device also comprises forming a recess in the substrate. The method for manufacturing a semiconductor device further comprises forming a semiconductor layer at a bottom of the recess. The method for manufacturing a semiconductor device comprises forming a first dielectric layer in the recess. The method for manufacturing a semiconductor device also comprises forming a filling structure to fill the recess. The method for manufacturing a semiconductor device further comprises forming a second dielectric layer on the filling structure. The method for manufacturing a semiconductor device comprises forming a pair of thermopile segments on the second dielectric layer. The method for manufacturing a semiconductor device also comprises removing the filling structure to form a chamber.

BRIEF DESCRIPTION OF THE DRAWINGS

The disclosed embodiments will be described in detail below in conjunction with the accompanying drawings. It is worth noting that, in accordance with standard practice in the industry, various features are not drawn to scale. In fact, the dimensions of the various features may be arbitrarily increased or reduced for clarity of discussion.

DETAILED DESCRIPTION OF THE INVENTION

Figure 1:
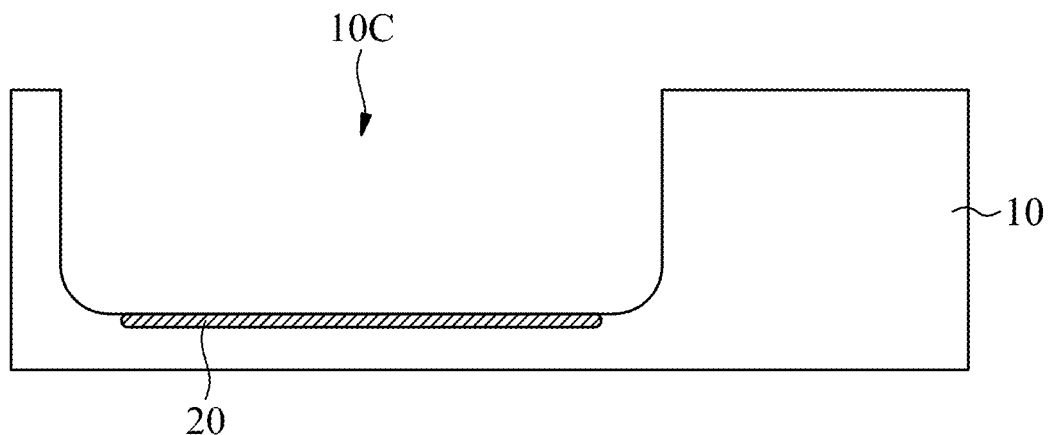
FIG. 1-6 are schematic views illustrating various steps in the forming of a semiconductor device which shown in FIG. 6 according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may comprise embodiments in which the first and second features are formed in direct contact, and may also comprise embodiments in which additional features may be formed between the first and second features, such that the first and second features may not be in direct contact.

It should be understood that additional operation steps may be implemented before, during, or after the method described herein, and some operation steps may be replaced or omitted in other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "about" and "substantially" typically mean+/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value comprises the meaning of "about" or "substantially".

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The different embodiments disclosed below may repeat reference numerals and/or letters in the various examples. This repetition is for the purpose of simplicity and clarity and does not in itself dictate a relationship between the various embodiments and/or configurations discussed.

In the present disclosure, a doped semiconductor layer and a dielectric layer may be used as a reflective layer of a semiconductor device. Since the reflective layer in the present disclosure is not formed of low-melting-point metal, so there are more choices for the material of thermopiles to enhance the performance of the semiconductor device (e.g., sensitivity). Moreover, in some embodiments of the present disclosure, it is not necessary to dispose the semiconductor device on the operating device (e.g., transistor), therefore, the thickness of chamber will be more flexible, and the relative processes are less likely to be limited.

Figure 4:
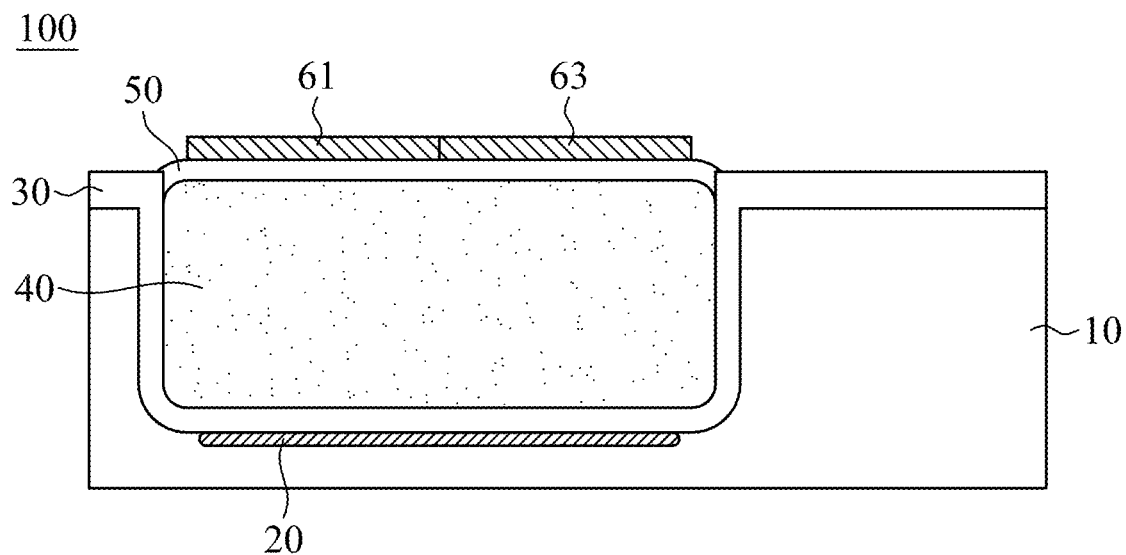
Figure 5:
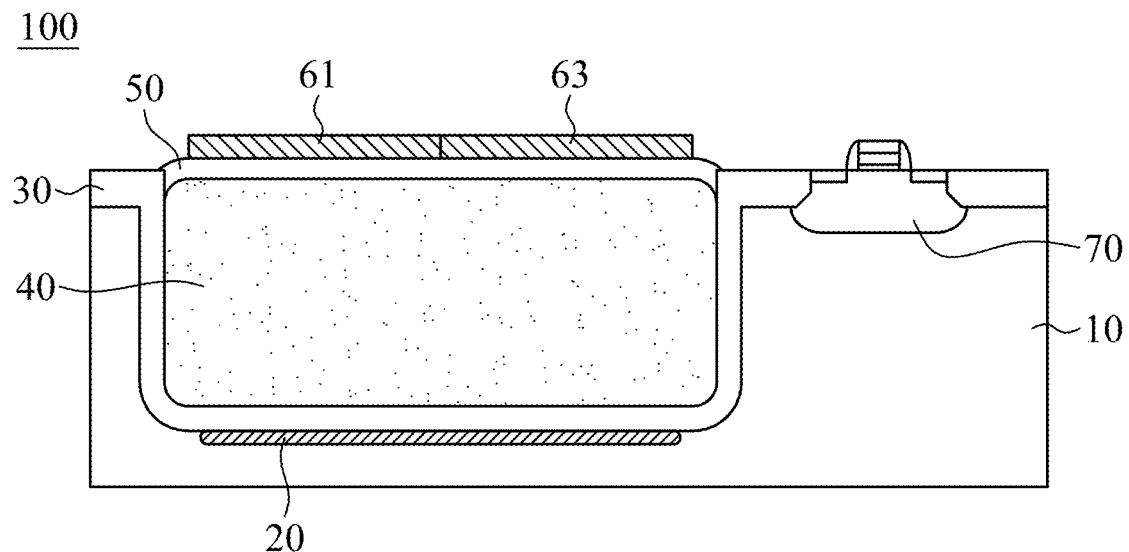
Figure 6:
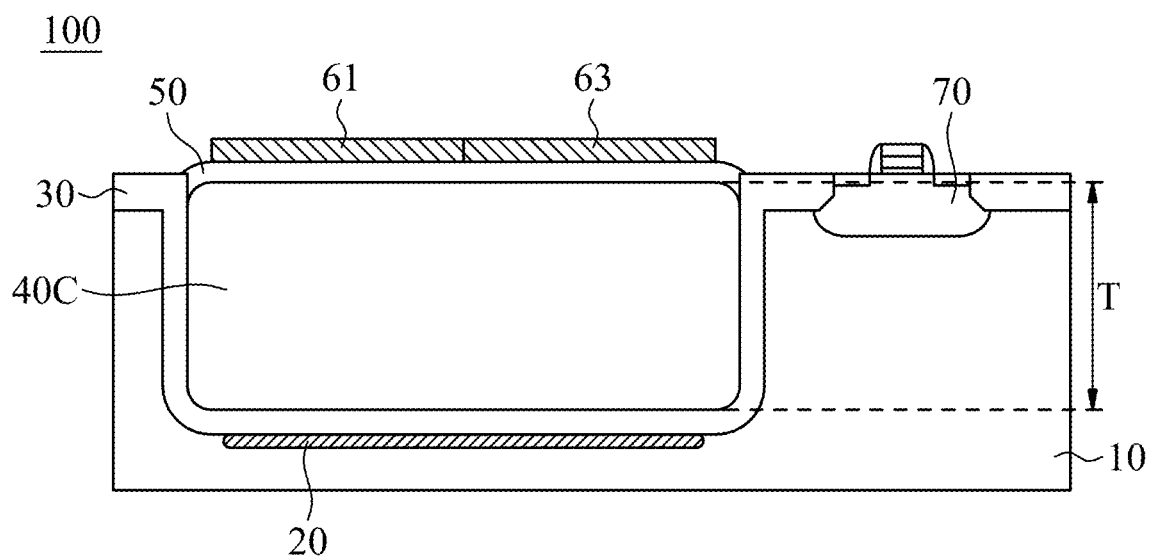

FIG. 1-6 are partial schematic views illustrating various steps in the forming of a semiconductor device 100 which shown in FIG. 6 according to some embodiments of the present disclosure. It should be noted that, in order to show the features of the present disclosure, FIG. 1-6 illustrate semiconductor device 100 in cross-sectional views, but they do not represent the specific cross-section of semiconductor device 100. Moreover, some components may be omitted in FIG. 1-6.

Referring to FIG. 1, providing a substrate 10. In some embodiments, the substrate 10 may include an elemental semiconductor, such as silicon or germanium; a compound semiconductor, such as silicon carbide, gallium nitride, gallium arsenide, gallium phosphide, indium phosphide, indium arsenide or indium antimonide; an alloy semiconductor, such as silicon germanium, gallium arsenide phosphide, aluminum indium phosphide, aluminum gallium arsenide, gallium indium arsenide, gallium indium phosphide, gallium indium arsenide phosphide or a combination thereof, but the embodiments of the present disclosure are not limited thereto. In some embodiments, the substrate 10 may be a semiconductor-on-insulator (SOI) substrate. The semiconductor-on-insulator substrate may include a base substrate, a buried oxide layer disposed on the base substrate and a semiconductor layer disposed on the buried oxide layer. In some embodiments, the substrate 10 may be a semiconductor wafer (e.g., silicon wafer or other suitable semiconductor wafer).

In some embodiments, substrate 10 may contain various isolation features to separate the different device regions in substrate 10. For example, the isolation features may include shallow trench isolation (STI) feature, but the embodiments of the present disclosure are not limited thereto. In some embodiments, forming the STI may include etching a trench in the substrate 10, and fill the trench with insulating material (e.g., silicon oxide, silicon nitride or silicon oxynitride). The filled trench may have a multilayer structure (e.g., a thermal oxide liner with silicon nitride filling the trench). Chemical mechanical polishing (CMP) may be performed to polish excess insulating material and planarize the upper surface of isolation features.

In some embodiments, substrate 10 may include various conductive feature (e.g., conductive line or via). For example, the conductive features may be formed of aluminum (Al), copper (Cu), tungsten (W), their alloy, other suitable conductive material or combination thereof.

Then, referring to FIG. 1, a recess 10C is formed in the substrate 10. In some embodiments, a patterned photoresist layer (not shown) may be formed on the substrate 10. For example, the patterned photoresist layer may be positive photoresist or negative photoresist. In some embodiments, the patterned photoresist layer may be a single layer structure or a multi-layer structure, and may be formed using, for example, deposition process, photolithography process, other suitable process or the combination thereof, but the embodiments of the present disclosure are not limited thereto.

In some embodiments, an etching process may be performed to etch the substrate 10 through the patterned photoresist layer to form the recess 10C. In some embodiments, etching process may include dry etching, wet etching, reactive ion etching (RIE) and/or other suitable process. However, the embodiments of the present disclosure are not limited thereto.

Then, referring to FIG. 1, a semiconductor layer 20 is formed at the bottom of recess 10C. In some embodiments, the semiconductor layer 20 may be formed using an ion implantation. For example, the semiconductor layer 20 with a concentration larger than $1E16$ $cm^{-3}$ may be formed using an ion implantation and a thermal process (e.g., annealing process), but the embodiments of the present disclosure are not limited thereto. In some embodiments, material of the semiconductor layer 20 is, for example, silicon (or germanium), and the semiconductor layer 20 may include dopants such as nitrogen, phosphorus, arsenic, antimony and bismuth, that is, the semiconductor 20 may be a heavily doped N-type semiconductor layer. Alternatively, the semiconductor layer 20 may include dopants such as boron, aluminum, gallium, indium and thallium, that is, the semiconductor 20 may be a heavily doped P-type semiconductor layer, but the embodiments of the present disclosure are not limited thereto.

Figure 2:
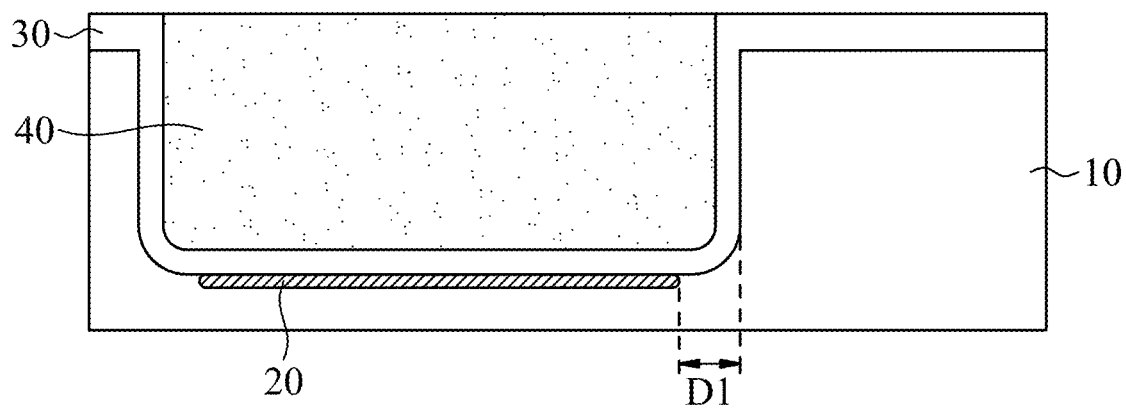

Referring to FIG. 2, a first dielectric layer 30 is formed in the recess 10C. More specifically, a first dielectric layer 30 is formed in the sidewalls and the bottom of the recess 10C and on the top surface of the substrate 10. In some embodiments, material of the first dielectric layer 30 may include silicon oxide, silicon nitride, silicon oxynitride, high dielectric constant (high-k) dielectric material, any other suitable material or the combination thereof, but the embodiments of the present disclosure are not limited thereto. In some embodiments, the high-k dielectric material may include LaO, AlO, ZrO, TiO, $Ta_2O_5$, $Y_2O_3$, $SrTiO_3$(STO), $BaTiO_3$ (BTO), BaZrO, $HfO_2$, $HfO_3$, HfZrO, HfLaO, HfSiO HfSiON, LaSiO, AlSiO, HfTaO, HfSiO, HfTaTiO, HfAlON (Ba,Sr)TiO$_3$(BST), Al$_2$O$_3$, other suitable high-k dielectric material or the combination thereof.

In some embodiments, the first dielectric layer 30 may be formed by a deposition process. For example, the first dielectric layer 30 may be formed by chemical vapor deposition (CVD), atomic layer deposition (ALD) or spin coating, but the embodiments of the present disclosure are not limited thereto. In some embodiments, the chemical vapor deposition may be low pressure chemical vapor deposition (LPCVD), low temperature chemical vapor deposition (LTCVD) or plasma enhanced chemical vapor deposition (PECVD).

Then, referring to FIG. 2, a filling structure 40 is formed to fill the recess 10C. In some embodiments, the filling structure 40 may be formed of polycrystalline silicon, but the embodiments of the present disclosure are not limited thereto. In some embodiments, the filling structure 40 may be formed using chemical vapor deposition (CVD), physical vapor deposition (PVD) (e.g., vacuum evaporation or sputtering process), other suitable process or the combination thereof, but the embodiments of the present disclosure are not limited thereto.

In some embodiments, a spacing D1 between an outermost side of the semiconductor layer 20 and an outermost side of the first dielectric layer 30 in the recess 10C is greater than 5 μm. In this case, the spacing D1 is defined as the shortest distance between the outermost side of the semiconductor layer 20 and the outermost side of the first dielectric layer 30 in the recess 10C in a direction parallel to the bottom surface of the substrate 10. In the other words, the outermost side of the semiconductor layer 20 and the outermost side of the first dielectric layer 30 in the recess 10C are separated from each other in a direction parallel to the bottom surface of the substrate 10. That is, the semiconductor layer 20 does not extend beyond the outermost side of the first dielectric layer 30 in the recess 10C.

Figure 3:
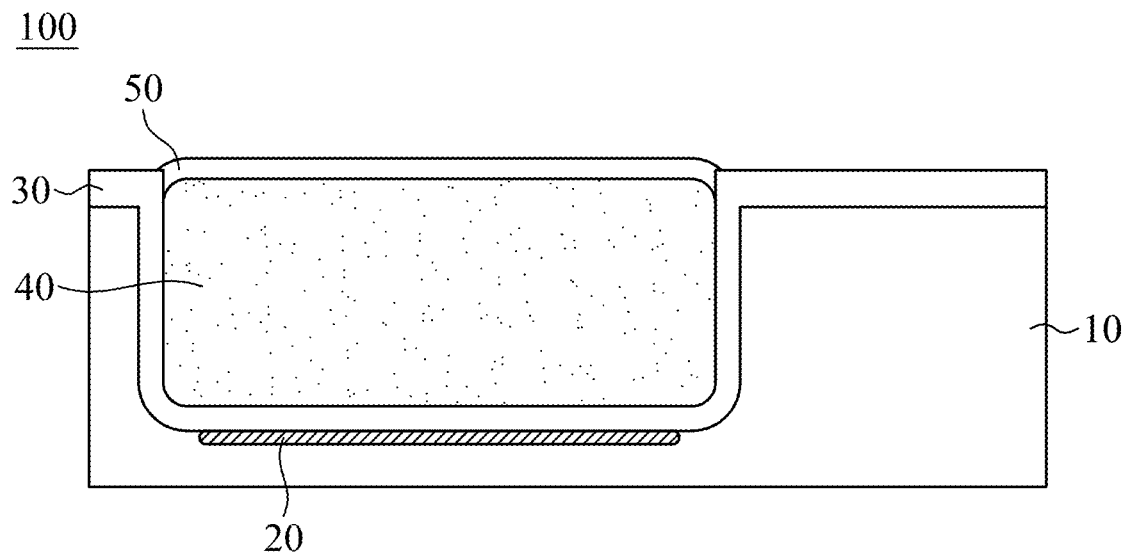

Referring to FIG. 3, a second dielectric layer 50 is formed on the first dielectric layer 30. More specifically, a second dielectric layer 50 is formed on the filling structure 40 and portions of the first dielectric layer 30. In some embodiments, the second dielectric layer 50 may be formed using thermal oxidation, but the embodiments of the present disclosure are not limited thereto. In some embodiments, the material of the second dielectric layer 50 may be the same with (or similar to) the first dielectric layer 30, and the second dielectric layer 50 may also be formed using deposition process. For example, the second dielectric layer 50 may be formed using chemical vapor deposition (CVD), atomic layer deposition (ALD) or spin coating, but the present disclosure is not limited to it. The example of chemical vapor deposition may be the same as those described above and is not repeated herein for brevity, but the embodiments of the present disclosure are not limited thereto.

Referring to FIG. 4, a pair of thermopile segments 61, 63 are formed on the second dielectric layer 50. In some embodiments, the material of the thermopile segments 61, 63 may include a P-type semiconductor (e.g., P-type heavily doped polysilicon) and an N-type semiconductor (e.g., N-type heavily doped polysilicon), respectively, but the embodiments of the present disclosure are not limited thereto. For example, the P-type semiconductor may include dopants, such as boron, aluminum, gallium, indium and thallium, and the N-type semiconductor may include dopants, such as nitrogen, phosphorus, arsenic, antimony and bismuth.

Referring to FIG. 5, a semiconductor element 70 is formed in the substrate 10. More specifically, as shown in FIG. 5, the semiconductor element 70 is adjacent to the thermopile segments 61, 63 and the filling structure 40, and the semiconductor element 70 is separated from the thermopile segments 61, 63 and the filling structure 40 by the first dielectric layer 30 and the second dielectric layer 50. In some embodiments, the semiconductor element 70 may include a transistor, a photodiode and/or a light-emitting diode. For example, semiconductor element 70 is a complementary metal-oxide-semiconductor (CMOS), but the embodiments of the present disclosure are not limited thereto. In some embodiments, the substrate 10 may include various p-type doped regions and/or n-type doped regions formed using such as ion implantation and/or diffusion process to form the semiconductor element 70.

In some embodiments, the semiconductor element 70 may include source/drain. An implantation region may be formed in the semiconductor element 70 by ion implantation, and a thermal process may be performed on the implantation region to form source/drain in semiconductor element 70. In some embodiments, the semiconductor element 70 may include a gate structure which may be disposed between the source/drain, but the embodiments of the present disclosure are not limited thereto.

In some embodiments, the gate structure may include a gate dielectric layer and a gate electrode disposed on the gate dielectric layer. In some embodiments, a dielectric material layer and a conductive material layer thereon may be sequentially deposited on the substrate 10 by blanket depositions, and then a gate dielectric layer and a gate electrode are formed respectively by patterning the dielectric material layer and the conductive material layer by photolithography and etching processes.

For example, the dielectric material layer may include silicon oxide, silicon nitride, silicon oxynitride, high-k dielectric materials, other suitable dielectric materials, or a combination thereof, but the embodiments of the present disclosure are not limited thereto. Examples of high-k dielectric materials may be the same as those described above and is not repeated herein for brevity, but the embodiments of the present disclosure are not limited thereto. In some embodiments, the dielectric material layer may be formed by chemical vapor deposition (CVD), atomic layer deposition (ALD) or spin coating, but the present disclosure is not limited to it. Examples of chemical vapor deposition may be the same as those described above and is not repeated herein for brevity, but the embodiments of the present disclosure are not limited thereto.

In some embodiments, the conductive material layer may be formed of polysilicon, but the embodiments of the present disclosure are not limited thereto. In some embodiments, the conductive material layer may be formed of metal (e.g., tungsten, titanium, aluminum, copper, molybdenum, nickel, platinum, similar metallic materials or a combination thereof), metal alloy, metal nitride (e.g., tungsten nitride, molybdenum nitride, titanium nitride, tantalum nitride, similar metal nitrides or a combination thereof), metal silicide (e.g., tungsten silicide, titanium silicide, cobalt silicide, nickel silicide, platinum silicide, hafnium silicide, similar metal silicide or a combination thereof), metal oxide (e.g., ruthenium oxide, indium tin oxide, similar metal oxide or a combination thereof), other suitable conductive materials or a combination thereof. In some embodiments, the conductive material layer may be formed using chemical vapor deposition, physical vapor deposition (e.g., vacuum evaporation process or sputtering process), other suitable process or a combination thereof, but the embodiments of the present disclosure are not limited thereto.

In some embodiments, the semiconductor element 70 includes an isolation structure, which may be disposed at the outer side of the source/drain, but the embodiments of the present disclosure are not limited thereto. In some embodiments, the material of the isolation structure may include dielectric materials, such as silicon oxide ($SiO_2$), silicon nitride (SiN), silicon oxynitride (SiON), aluminum oxide ($Al_2O_3$), aluminum nitride (AlN), magnesium oxide (MgO), magnesium nitride ($Mg_3N_2$), zinc oxide (ZnO), Titanium oxide ($TiO_2$), other suitable materials or a combination thereof, but the embodiments of the present disclosure are not limited thereto.

In some embodiments, the isolation structure may be formed using deposition process, photolithography process, other suitable process or the combination thereof, but the present disclosure is not limited to it. For example, the photolithography process may include photoresist coating (e.g., spin-on coating), soft baking, mask aligning, exposure, post-exposure baking (PEB), developing, rinsing, drying (e.g., hard baking), other suitable process or a combination thereof, but the embodiments of the present disclosure are not limited thereto.

Referring to FIG. 6, remove the filling structure 40 to form a chamber 40C. For example, an etching process may be performed to etch the thermopile segments 61, 63 and the second dielectric layer 50 through specific patterned photoresist to form an etched trench (not shown). Examples of etching process may be as described above, and will not be repeated here, but the embodiments of the present disclosure are not limited thereto.

Then, in order to form semiconductor device 100, the filling structure 40 is removed through the etched trench to form a chamber 40C at the region originally occupied by the filling structure 40. For example, a plasma etching may be performed to the filling structure 40 by passing the gas through the etched trench to form the chamber 40C, so that the thermopile segments 61, 63 are formed into a suspended structure, but the embodiments of the present disclosure are not limited thereto.

As shown in FIG. 6, in some embodiments, the semiconductor device 100 includes a substrate 10, wherein a chamber 40C is disposed in the substrate 10. In some embodiments, the semiconductor device 100 also includes a dielectric layer (that is, the first dielectric layer 30 and the second dielectric layer 50), the dielectric layer surround the chamber 40C. More specifically, the dielectric layer includes the first dielectric layer 30 and the second dielectric layer 50, the first dielectric layer 30 is disposed at the sidewall and the bottom of the chamber 40C, and the second dielectric layer 50 is disposed at the top of the chamber 40C. In some embodiments, the semiconductor device 100 further includes a semiconductor layer 20, which disposed at the bottom of the dielectric layer (the first dielectric layer 30). In some embodiments, the semiconductor device 100 includes a pair of the thermopile segments 61, 63 which are disposed on the dielectric layer (the second dielectric layer 50). In some embodiments, the semiconductor device 100 includes a semiconductor element 70, and the semiconductor element 70 is formed in the substrate 10 and adjacent to the pair of thermopile segments 61, 63 and the chamber 40C. In some embodiments, the semiconductor element 70 is separated from the pair of thermopile segments 61, 63 and the chamber 40C by the first dielectric layer 30 and the second dielectric layer 50.

In some embodiments, the semiconductor device 100 may serve as a thermal sensing device. As shown in FIG. 6, the chamber 40C of the semiconductor device 100 is not disposed on the semiconductor element 70 (e.g., transistor), and the thermopile segments 61, 63 are formed before the forming of semiconductor element 70 and therefore, the overall height of the semiconductor device 100 may be lowered to reduce the difficulties of relative processes, and to improve the adjustability of height T (as shown in FIG. 6) of the chamber 40C.

Moreover, the outermost side of the semiconductor layer 20 and the outermost side of the first dielectric layer 30 in the chamber 40C are separated from each other in a direction parallel to the bottom surface of the substrate 10 (that is, the semiconductor layer 20 does not extend beyond the outermost side of the first dielectric layer 30 in the chamber 40C), therefore, the semiconductor layer 20 is less likely to impact the subsequently formed semiconductor element 70.

Furthermore, the doped semiconductor layer 20 and the first dielectric layer 30 may be used as a reflecting layer of the semiconductor device 100 in the embodiments of the present disclosure, and the melting point of the doped semiconductor layer 20 is higher than typical metal reflecting layer, therefore, the material of the subsequently formed thermopile segments 61, 63 are less likely to impact the formed semiconductor layer 20, that is, there are more choices of material of the thermopile segments 61, 63.

The sensitivity of the thermal sensing device may be determined by the Seebeck effect. Due to the Seebeck effect, the voltage V measured by the thermal sensing device may calculated using following formula: $V=(\alpha_A-\alpha_B) \times \Delta T$, wherein $\alpha_A$ and $\alpha_B$ are Seebeck coefficients of the thermopile segments 61, 63, respectively, and $\Delta T$ is the temperature difference between the junction of the thermopile segments 61 and 63 and the two ends of the thermopile segments 61 and 63.

Seebeck coefficients of different materials are listed in following Table 1.

TABLE 1

| material | Seebeck coefficient ($\mu$V/K) (relative to platinum at 300 K) |
|---|---|
| aluminum | −1.7 |
| chromium | 18.8 |
| gold | 1.79 |
| copper | 1.70 |
| platinum | −4.45 |
| nickel | −18 |
| bismuth | −79 |
| antimony | 43 |
| P-type silicon | 300~3000 |
| N-type silicon | −200~−500 |

As shown in Table 1, comparing to using metals (for example, aluminum, chromium, gold, copper, platinum, nickel, bismuth, antimony, etc.) as the materials of the thermopile segments 61, 63, P-type semiconductor (e.g., P-type silicon) and N-type semiconductor (e.g., N-type silicon) are used as the material of the thermopile segments 61, 63 of semiconductor device 100 in the embodiments of the present disclosure to increase the difference between the Seebeck coefficients of the thermopile segments 61 and the thermopile segments 63. Therefore, even if the temperature difference $\Delta T$ is small, a large voltage V may be obtained. That is, the sensitivity of the semiconductor device 100 may be further improved.

Moreover, as the sensitivity of the thermopile segments 61, 63 is improved, the overall size of the thermopile segments 61, 63 or the semiconductor device 100 may be further reduced, and the size of the thermopile segments 61, 63 array may be increased.

In the present disclosure, the semiconductor device 100 may be applied to more precise sensing devices due to the elevated sensibility. For example, the semiconductor device 100 in the present disclosure may be applied to self-driving cars, (infrared) cameras, home electronics, or the like, but the embodiments of the present disclosure are not limited thereto.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection of the present disclosure is defined as the subject matter set forth in the appended claims. While the present disclosure has been disclosed above by several preferred embodiments, it is not intended to limit the present disclosure.

Reference throughout this specification to features, advantages, or similar language does not imply that all of the features and advantages that may be realized with the present invention disclosure should be or are in any single embodiment of the present disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, represent the same embodiment.

Furthermore, the described features, advantages, and characteristics of the present disclosure may be combined in any suitable manner in one or more embodiments. One skilled in the relevant art will recognize, in light of the description herein, that the present disclosure can be practiced without one or more of the specific features or advantages of a particular embodiment. In other instances, additional features and advantages may be recognized in certain embodiments that may not be present in all embodiments of the present disclosure.

What is claimed is:

1. A semiconductor device, comprising:
    a substrate comprising a semiconductor material;
    a semiconductor layer disposed in the semiconductor material of the substrate;
    a first dielectric layer disposed on the semiconductor layer, wherein the semiconductor layer and the first dielectric layer are used as a reflecting layer of the semiconductor device;
    a second dielectric layer disposed on the first dielectric layer; and
    a pair of thermopile segments disposed on the second dielectric layer;
    wherein the first dielectric layer and the second dielectric layer form a chamber in the semiconductor material of the substrate, the first dielectric layer is conformally formed on a bottom and a sidewall of the chamber, and the first dielectric layer in the chamber extends beyond the semiconductor layer in a direction parallel to a bottom surface of the substrate.

2. The semiconductor device as claimed in claim 1, wherein the semiconductor layer is a heavily doped N-type semiconductor layer or a heavily doped P-type semiconductor layer.

3. The semiconductor device claimed in claim 2, wherein a concentration of the semiconductor layer is greater than $1E16 cm^{-3}$.

4. The semiconductor device as claimed in claim 1, wherein a material of the pair of thermopile segments comprises an N-type semiconductor and a P-type semiconductor.

5. The semiconductor device as claimed in claim 1, further comprising:
    a semiconductor element disposed in the substrate and adjacent to the pair of thermopile segments and the chamber.

6. The semiconductor device as claimed in claim 5, wherein the semiconductor element is separated from the pair of thermopile segments and the chamber by the first dielectric layer and the second dielectric layer.

7. A semiconductor device, comprising:
    a substrate comprising a semiconductor material having a chamber in the semiconductor material of the substrate;
    a dielectric layer surrounding the chamber;
    a semiconductor layer disposed at a bottom of the dielectric layer; and
    a pair of thermopile segments disposed on the dielectric layer,
    wherein the dielectric layer has a first portion conformally formed on a bottom and a sidewall of the chamber and a second portion conformally formed on a top of the chamber, the first portion of the dielectric layer in the chamber extends beyond the semiconductor layer in a direction parallel to a bottom surface of the substrate, and the semiconductor layer and the first portion of the dielectric layer are used as a reflecting layer of the semiconductor device.

8. The semiconductor device as claimed in claim 7, wherein the dielectric layer comprises:
    a first dielectric layer disposed at sidewalls and a bottom of the chamber; and
    a second dielectric layer disposed at a top of the chamber.

9. The semiconductor device as claimed in claim 7, wherein the semiconductor layer is a heavily doped N-type semiconductor layer or a heavily doped P-type semiconductor layer.

10. The semiconductor device as claimed in claim 9, wherein a concentration of the semiconductor layer is greater than $1E16 cm^{-3}$.

11. The semiconductor device as claimed in claim 7, wherein a material of the pair of thermopile segments comprises an N-type semiconductor and a P-type semiconductor.

12. The semiconductor device as claimed in claim 1, wherein a spacing between the outermost side of the semiconductor layer and the outermost side of the first dielectric layer in the chamber is greater than 5 μm.

* * * * *